（12） United States Patent
Nakano et al.

(10) Patent No.: US 7,714,286 B2
(45) Date of Patent: May 11, 2010

(54) CHARGED PARTICLE BEAM APPARATUS, ABERRATION CORRECTION VALUE CALCULATION UNIT THEREFOR, AND ABERRATION CORRECTION PROGRAM THEREFOR

(75) Inventors: Tomonori Nakano, Kokubunji (JP); Takeshi Kawasaki, Musashino (JP); Kotoko Hirose, Abiko (JP); Makoto Ezumi, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 166 days.

(21) Appl. No.: 12/121,924

(22) Filed: May 16, 2008

(65) Prior Publication Data

US 2009/0008550 A1    Jan. 8, 2009

(30) Foreign Application Priority Data

May 17, 2007    (JP) .............................. 2007-131518

(51) Int. Cl.
    *G01N 23/00*    (2006.01)
(52) U.S. Cl. .................................. 250/310; 250/396 R
(58) Field of Classification Search ................. 250/310, 250/396 R
    See application file for complete search history.

(56) References Cited

U.S. PATENT DOCUMENTS

| 6,184,975 | B1 * | 2/2001 | Henstra et al. .............. 356/123 |
| 6,825,480 | B1 | 11/2004 | Watanabe et al. |
| 6,858,844 | B2 | 2/2005 | Zach |
| 6,982,427 | B2 | 1/2006 | Kawasaki et al. |
| 7,095,031 | B2 | 8/2006 | Uno |
| 7,145,154 | B2 | 12/2006 | Uno |
| 7,211,804 | B2 | 5/2007 | Yoshida et al. |
| 7,223,983 | B2 | 5/2007 | Kawasaki et al. |
| 7,544,939 | B2 * | 6/2009 | van der Zande et al. ..... 250/311 |
| 2006/0175548 | A1 | 8/2006 | Kawasaki et al. |
| 2006/0255269 | A1 | 11/2006 | Kawasaki et al. |
| 2007/0181806 | A1 | 8/2007 | Nakano et al. |

FOREIGN PATENT DOCUMENTS

| JP | 2001-068048 | 3/2001 |
| JP | 2005-183085 | 7/2005 |
| JP | 2005-353429 | 12/2005 |

OTHER PUBLICATIONS

J. Zach et al., "Aberration correction in a low voltage SEM by a multipole corrector", Nuclear Instruments and Methods in Physics Research, A363 (1995), pp. 316-325.

* cited by examiner

*Primary Examiner*—Kiet T Nguyen
(74) *Attorney, Agent, or Firm*—Antonelli, Terry, Stout & Kraus, LLP.

(57) ABSTRACT

A charged particle beam apparatus includes: a correction image acquisition part 52 for making a detector 20 acquire items of two-dimensional image data at different focal positions; a directional differentiation operation part 53 for obtaining directional derivative values in a plurality of directions for each of the items of two-dimensional image data at different focal positions; an aberration parameter calculation part 54 for obtaining aberration parameters according to previously determined methods by using the directional derivative values in a plurality of directions for each of the items of two-dimensional image data; an aberration correction value calculation part 55 for obtaining correction values for aberrations by using the aberration parameters; and a control part 56 for setting the correction values in a correction optical system control means to make an aberration corrector 16 correct the aberrations.

13 Claims, 9 Drawing Sheets

CHARGED PARTICLE BEAM APPARATUS, ABERRATION CORRECTION VALUE CALCULATION UNIT THEREFOR, AND ABERRATION CORRECTION PROGRAM THEREFOR

CLAIM OF PRIORITY

The present application claims priority from Japanese application JP 2007-131518 filed on May 17, 2007, the content of which is hereby incorporated by reference into this application.

BACKGROUND OF THE INVENTION

The present invention relates to a charged particle beam apparatus that scans a specimen by irradiation of a charged particle beam to obtain secondary electrons from the specimen, and to an aberration correction value calculation unit therefor and an aberration correction program therefor.

A charged particle beam apparatus (for example, an electron microscope such as a scanning electron microscope (SEM) or a transmission electron microscope (TEM)) necessarily uses a lens that utilizes an electric field or magnetic field in order to focus a charged particle beam. Various types of aberration occur inevitably in electric field lenses and magnetic field lenses. As a result, simple narrowing of a spot diameter of a charged particle beam by reducing the magnification of a lens does not lead to an image of good quality if aberration of the charged particle beam is large.

Consequently, many charged particle beam apparatuses incorporate an aberration corrector in order to obtain an excellent image. Usually, an aberration corrector comprises multipole lenses arranged in multiple stages, and generates an electric field or a magnetic field within the multipole lenses in order to remove aberration included in a charged particle beam that has passed through the inside of the lenses.

Such an aberration corrector, which uses four stages of multipole lenses, is disclosed in the following Non-patent Document 1, for example.

Non-patent Document 1: Nuclear Instruments and Methods in Physics Research, A363 (1995), pp. 316-325.

Further, there is a technique of detecting and correcting aberration of a charged particle beam apparatus, as disclosed in Japanese Un-examined Patent Application Laid-Open No. 2005-183085 (hereinafter, referred to as Patent Document 1), for example. In this technique, a just-focused (i.e. in-focus) image and a plurality of defocused images are acquired, each item of image data is subjected to Fourier transformation, the Fourier transformed defocused image data are divided by the Fourier transformed in-focus image data, and the obtained value is subjected to inverse Fourier transformation, to obtain beam profile data. Various aberrations are obtained on the basis of the beam profile data, and the various aberrations are removed by operating an aberration corrector according to the various aberrations. Further, Japanese Un-examine Patent Application Laid-Open No. 2001-068048 (hereinafter, referred to as Patent Document 2) discloses a technique of correcting astigmatism by using items of image data having different focus conditions.

However, when each aberration is obtained by the method described in Patent Document 1, high S/N (signal to noise) ratio image data should be obtained. Thus, there is a problem in that obtainment of each aberration requires a lot of time, and as a result, obtainment of aberration correction requires a lot of time.

The noise in question include noise generated in the course of generation of a charged particle beam and in the course of generation of secondary particles, and noise generated in a detector for detecting the secondary particles, an amplifier for amplifying the output of the detector, and the like. The former noise is stochastic noise concerning particles, and result from, for example, dispersion of the number of generated charged particles or dispersion of the number of generated secondary particles. The latter noise is generated by devices themselves, such as the detector or the amplifier.

In the technique of Patent Document 1, division of the Fourier transformed defocused image data by the Fourier transformed in-focus image data means multiplication of random noise included in the defocused image data by random noise included in the in-focus image data. As a result, the final obtained beam profile data include much noise. Thus, it is necessary to obtain high S/N image data, for example by slowing the scanning speed of charged particle beam.

Patent Document 2 discloses a technique of correcting astigmatism, but does not disclose a technique of correcting higher-order aberration (second order or higher aberration) such as coma aberration and star aberration.

SUMMARY OF THE INVENTION

The present invention has been made recognizing such problems of the conventional techniques. An object of the present invention is to provide a charged particle beam apparatus that can shorten the time required for correction of aberration, an aberration correction value calculation unit therefor, and an aberration correction program therefor.

According to the present invention, a specimen is scanned with a primary charged particle beam while changing focus conditions; two-dimensional intensity distribution data on the secondary charged particles are acquired by detecting the secondary charged particles (secondary electrons, backscattered electrons, and the like); directional dependency of asymmetry of the acquired two-dimensional distribution data of directional dependency of degree of directional skewness is calculated; and aberration parameters are obtained to control an aberration corrector.

Here, "aberration parameter" means parameters required for determining operation conditions of the aberration corrector, and the aberration parameters are quantities that can be converted to and from aberration coefficient by prescribed formulas. When the operation conditions of the aberration corrector are determined in practice, it is sufficient in many cases to obtain the aberration parameters. It is not frequently required to obtain the aberration coefficients. The "asymmetry" or "degree of directional skewness" is the sum of derivative values or amounts of skewness for specific directions at points on a one-dimensional profile cut out along a line segment from the two-dimensional distribution data, and can be calculated from an index called a directional sharpness. The "directional sharpness" is the sum of gradients for specific directions at the points constituting the two-dimensional distribution data. When anisotropies owing to factors other than the beam, i.e. factors such as the inclination or structure information (a pattern biased in a specific direction) of the specimen, are removed, the "directional sharpness" depicts a curve having a local maximum value when the "directional sharpness" (which corresponds physically to the sum of asymmetries of amount of blurring caused by aberration) is plotted with respect to focus values at which the two-dimensional distribution data have been obtained. In the case where the aberration included in the acquired two-dimensional distribution data is two-fold symmetric, the focus-dependent curve of the directional sharpness is distributed symmetrically centering at the local maximum value. On the other hand, in the case where spherical aberration or star aberration exists, the focus-dependent curve of the directional sharpness is distorted in the distribution centering at the local maximum value. Such "asymmetry" or "degree of directional skewness" relates to aberration parameters. The present invention performs fitting of the above "asymmetric" or "degree of directional skewness" curve by using desired aberration parameters as fitting parameters, in order to obtain various aberration parameters. Correction values (i.e., aberration corrector operation conditions) to be given to the aberration corrector are determined. Information on anisotropy and the like of the specimen is cancelled by calculation as far as skewness is not used, and has no effect. Information using skewness is removed by specific processing at the time of fitting.

Thus, according to the present invention, directional derivative values in a plurality of directions are obtained for each of a plurality of two-dimensional images of different focal positions, and aberration parameters are obtained from these directional derivative values. When the aberration parameters are obtained from the directional derivative values, random noise is removed in the course of differentiating a two-dimensional image. Thus, the aberration parameters can be obtained accurately even for a relatively coarse two-dimensional image. Thus, according to the present invention, it is possible to acquire an image in a short time, for example, by raising the speed of scanning with a charged particle beam. As a result, the time required for correcting aberration can be shortened. Further according to the present invention, it is possible to reduce damage to a specimen because the speed of scanning with a charged particle beam can be raised.

DETAILED DESCRIPTION

Figure 1:
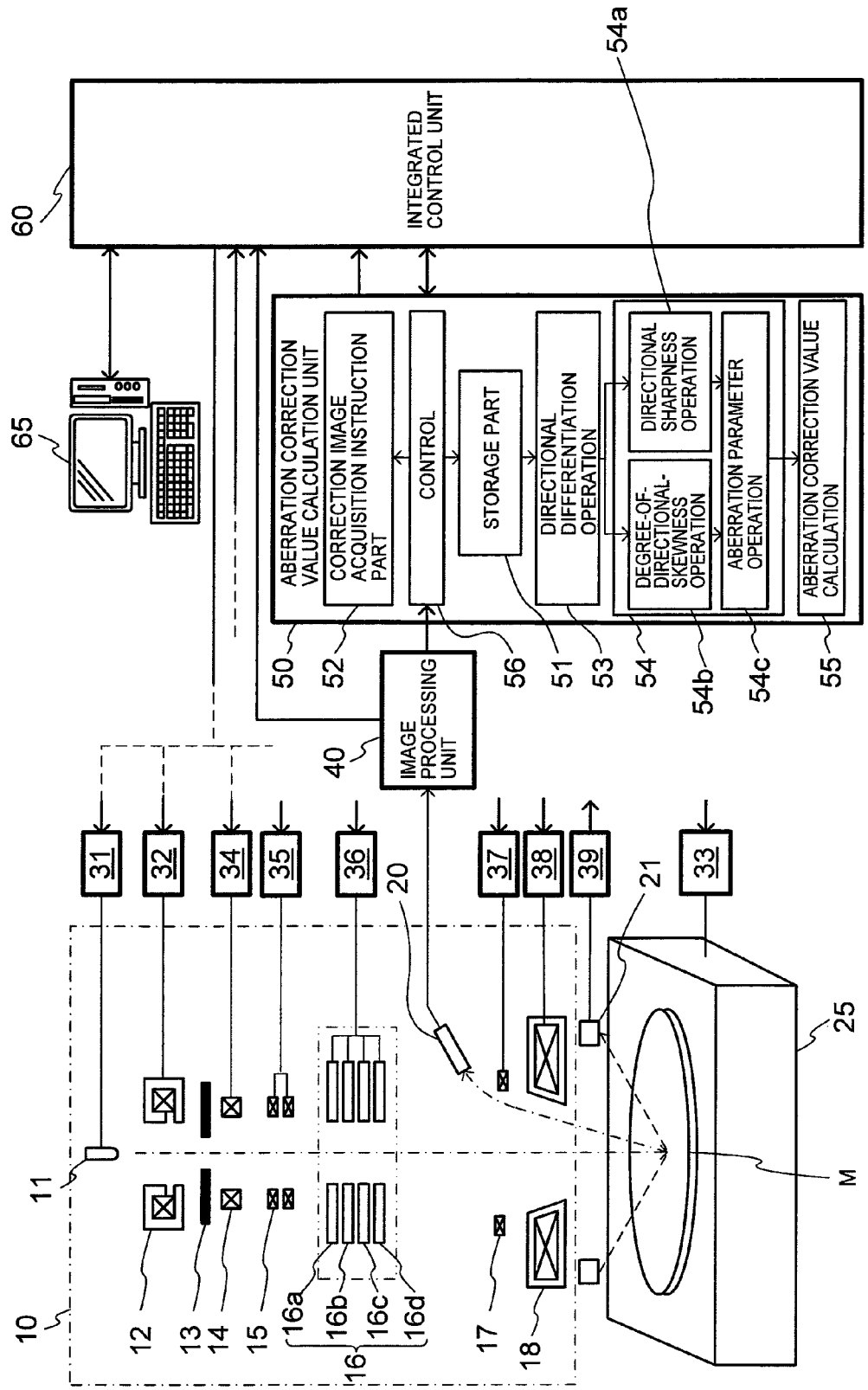
FIG. 1 is an explanatory diagram showing a configuration of a scanning electron microscope as an embodiment of the present invention.

In the following, an embodiment of a charged particle beam apparatus according to the present invention will be described referring to the drawings.

As shown in FIG. 1, the charged particle beam apparatus of the present embodiment is a scanning electron microscope (SEM), and comprises: an electron optical system 10 having a function of scanning a specimen M by irradiating it with an electron beam to output a detection signal indicating detection of secondary charged particles; an optical system control means for controlling the electron optical system 10; a specimen chamber for storing the specimen M; an image signal processing unit 40; an aberration correction value calculation unit 50; an integration control unit 60; and the like. Further, the electron optical system 10 comprises: an irradiation optical system for irradiating the specimen with primary charged particles; and a detection optical system for detecting the secondary charged particles generated by irradiation of the primary charged particle beam.

The irradiation optical system comprises: an electron gun 11 for generating an electron beam; a condenser lens 12 for converging the electron beam; a beam aperture 13 for narrowing down the electron beam; an astigmatism correction coil 14 for correcting the astigmatism; a deflection coil 15; an aberration corrector 16 for correcting various aberrations; a scanning coil 17 for scanning a specimen M with the electron beam; and an objective lens 18 for focusing the electron beam on the specimen M. The detection optical system comprises a detector 20 for detecting secondary electrons from the specimen M.

The aberration corrector 16 is a device that gives aberrations that are the reverse of the aberrations generated by the lens system so that the aberrations are finally removed from the electron beam arriving at the specimen M. The aberration corrector 16 comprises four stages of multipole lenses 16a, 16b, 16c and 16d, and has a function of giving reverse aberrations to the charged particle beam passing through its inside by means of electric fields and magnetic fields generated within the multipole lenses. Aberrations generated in the electron optical system are calculated in advance, and the quantities of the reverse aberrations to give are adjusted so that the aberrations included in the charged particle beam can be removed when the charged particle beam arrives at the surface of the specimen. Although an astigmatism corrector, a deflector and Wien filter for example are each a kind of a multipole lens, each of them is a device for correcting one kind of aberration exclusively. Thus, they are essentially different from the aberration corrector of the present embodiment, which comprises multipole lenses arranged in multiple stages and can correct a plurality of aberrations such as chromatic aberration and spherical aberration at the same time and can correct aberrations as by-products generated at the time of correction.

The "optical system control means" comprises: power supply circuits 31-38 for supplying drive voltages and driving current respectively to the components of the electron optical system 10; and the integration control unit 60. In the following description, a function of changing the focus of primary charged particles among the functions of the "optical system control means" is also referred to as a "focus control means". In that case, the "focus control means" comprises the integration control unit 60 and an objective lens power supply circuit 38. Further, a function of controlling the operation of the aberration corrector is also referred to as a "correction optical system control means". In that case, the "correction optical system control means" comprises the integration control unit 60 and an aberration corrector power supply circuit 36.

The specimen chamber comprises: a stage 25 for mounting a specimen M; a height sensor 21 for detecting the height of the specimen M; a retarding electrode (not shown) for supplying retarding potential to the specimen M held on the stage 25; a sensor controller 39 for controlling the drive of the height sensor 21 and converting an analog signal from the height sensor into a digital signal; and a stage controller 33 for controlling the drive of the stage 25. The sensor controller 39 receives a control signal from the integration control unit 60, converts the analog signal from the height sensor 16 into the digital signal as described above, and sends the converted digital signal to the integration control unit 60.

The image processing unit 40 synchronizes the output signal of the detector 20 with the scanning frequency of the primary charged particle beam, and two-dimensional distribution data of the secondary charged particles. An item of data clipped from the obtained two-dimensional distribution data into a range corresponding to a prescribed visual field is referred to as frame data. When such frame data are integrated a predetermined number of times or subjected to prescribed image processing, the obtained data are referred to as an image. The image processing unit 40 of the present embodiment has a function of calculating any of two-dimensional distribution data, frame data and an image.

The power supply circuits 31-38 include: an electron gun power supply circuit 31, a condenser lens power supply circuit 32, an astigmatism correction coil power supply circuit 34, a deflection coil power supply circuit 35, the aberration corrector power supply circuit 36, a scanning coil power supply circuit 37, and the objective lens power supply circuit 38 for controlling respectively drive of the electron gun 11, drive of the condenser lens 12, drive of the astigmatism correction coil 14, drive of the deflection coil 15, drive of the aberration corrector 16, drive of the scanning coil 17, and drive of the objective lens 18. These power supply circuits 31-38 each receive a control signal from the integration control unit 60.

The aberration correction value calculation unit 50 determines a current value or a voltage value to be outputted from the aberration corrector power supply circuit 36. The integration control unit 60 controls the power supply circuits and the like 31-39, the image processing unit 40, and the aberration correction value calculation unit 50 in an integrated manner. The aberration correction value calculation unit 50 further comprises an input-output unit 65 for displaying output from the integration control unit 60 on the one hand and for giving instructions to the integration control unit 60 on the other hand.

Functionally, the aberration correction value calculation unit 50 comprises: a storage part 51 for storing two-dimensional image data and the like from the image processing unit 40; a correction image acquisition instruction part 52 for giving an instruction to acquire an image for aberration correction; a directional differentiation operation part 53 for obtaining directional derivative values in a plurality of directions with respect to two-dimensional image data; an aberration parameter calculation part 54 for calculating various aberration parameters by using the directional derivative values in the plurality of directions; an aberration correction value calculation part 55 for obtaining correction values for various aberrations by using the aberration parameters; and a control part 56 for controlling the above-mentioned functional parts 52-55 and for giving the correction values for the various aberrations to the integration control unit 60 to make it correct the various aberrations by means of the aberration corrector 16.

The parameter calculation part 54 comprises: a directional sharpness operation part 54a for obtaining a directional asymmetry of each direction by using the directional derivative values in the plurality of directions; a degree-of-directional-skewness operation part 54b for obtaining a degree of directional skewness of each direction by using the plurality of directions; and an aberration parameter operation part 54c for obtaining various aberration parameters by using directional sharpness and the directional skewness. In the case where aberration parameters corresponding to n-fold symmetric aberrations (n: an even number, such as 2-fold aberration, 4-fold aberration, etc.) are to be obtained, the aberration parameter operation part 54c calculates the aberration parameters by using the operation result of the directional sharpness operation part 54a. On the other hand, in the case where aberration parameters corresponding to n-fold symmetric aberrations (n: an odd number, such as 1-fold (=astigmatism), 3-fold, etc.) are to be obtained, the aberration parameter operation part 54c calculates the aberration parameters by using the operation result of the degree-of-directional-skewness operation part 54b. According to the configuration of the electron microscope of the present embodiment, the parameter calculation part 54 includes both the directional sharpness operation part 54a and the degree-of-directional-skewness operation part 54b. However, depending on the kinds of aberration parameters to be obtained, the parameter calculation part 54 may include only one of them. The above-mentioned directional derivative values, directional sharpness, directional asymmetry and directional skewness will be described in detail later.

Each of these aberration correction value calculation unit 50, image processing unit 40 and integration control unit 60 is a computer, which comprises a CPU for executing various operations, a memory, an external storage, an input interface, an output interface, and the like. Accordingly, each of the functional parts 52-56 of the aberration correction value calculation unit 50 is implemented when the CPU executes a program stored in the external storage or the memory. Further, the storage part 51 of the aberration correction value calculation unit 50 is implemented to have the external storage or the memory.

Further, the input-output unit 65 is also a computer, which comprises a display unit for displaying various kinds of data and an input unit for receiving various instructions in addition to a CPU for executing various operations, a memory, an external storage, an input interface, and an output interface.

Figure 2:
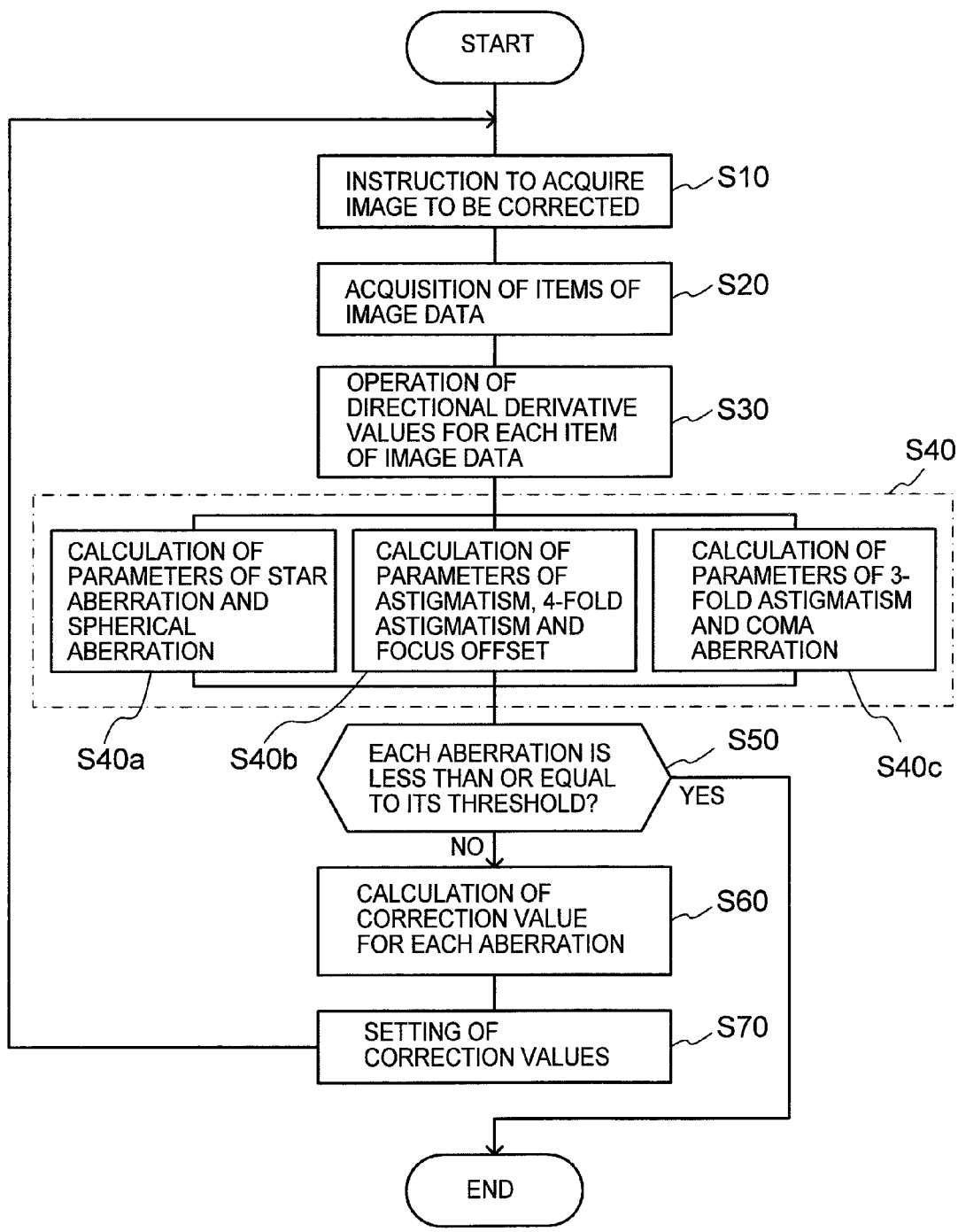
FIG. 2 is a flowchart showing aberration correction operation of the scanning electron microscope of the embodiment of the present invention.

Next, operation of the aberration correction value calculation unit 50 of the present embodiment will be described referring to the flowchart shown in FIG. 2.

First, the correction image acquisition instruction part 52 of the aberration correction value calculation unit 50 instructs the integration control unit 60 to acquire items of frame data that are to be used for aberration correction and have respective focal positions different from one another (S10). Receiving this instruction, the integration control unit 60 gives a control instruction to the objective lens power supply circuit 38 to control drive of the objective lens 18 in order to change the focal position (focus f) such that the focus is changed sequentially while irradiating an area formed with a pattern including edge components equally in each direction on a specimen M with an electron beam. Here, among the realized focuses, one focus is a just focus and the others defocuses. Further, in the present embodiment, it is assumed that the number of items of frame data is 10 or more. The detector 20 detects secondary electrons from the specimen M each time the focus is changed, and sends them to the image processing unit 40. The image processing unit 40 generates an item of two-dimensional distribution data for each focus, and sends the generated two-dimensional distribution data to the aberration correction value calculation unit 50.

When the items of two-dimensional distribution data are acquired from the image processing unit 40 (S20), the control part 56 of the aberration correction value calculation unit 50 stores them in the storage part 51. Next, the directional differentiation operation part 53 of the aberration correction value calculation unit 50 obtains directional derivative values in a plurality of directions for each item of two-dimensional distribution data (S30). Here, derivative values are obtained for directions of 0°, 22.5°, 30°, 45°, 90°, 120° and 135°.

Figure 6:
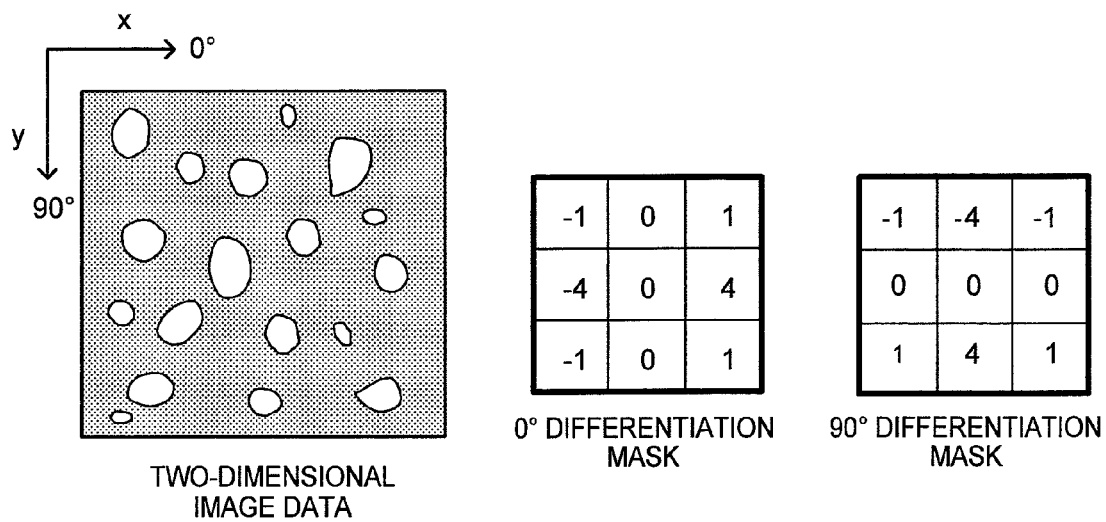
FIG. 6 is an explanatory diagram showing a method of applying directional differentiation to two-dimensional image data.

Here, a method of obtaining directional derivative values will be described referring to FIG. 6. For example, in the case where two-dimensional distribution data as shown in FIG. 6 are obtained, 0° differentiation mask (i.e., x-direction sobel differential filter) and 90° differentiation mask (i.e., y-direction sobel differential filter) are prepared assuming that one direction of the frame data is an x-axis direction and the direction perpendicular to that direction is a y-axis direction. The stage controller 33 has an x, y-coordinate system for controlling drive of the stage, and usually the above-mentioned x-axis and y-axis are determined in accordance with the x, y-coordinate system for the stage drive control. The x-axis direction is 0° and the y-axis direction is 90°. In the case of the 0° differentiation mask of the present embodiment, "−4", "0" and "4" are lined up in the 0° direction. In the case of the 90° differentiation mask, "−4", "0" and "4" are lined up in the 90° direction. To obtain 0° derivative value of some item of pixel data of frame data, the pixel data in question is multiplied by "0" in the center of the 0° differentiation mask, and each item of pixel data around that item of pixel data is also multiplied by the numerical value at the corresponding position in the 0° differentiation mask. Then, the sum of these values becomes the 0° derivative value of the item of pixel data in question. By performing the above processing with respect to all items of pixel data of the frame data, 0° derivative value data of the frame data are obtained. Further, to obtain 90° derivative value data of the frame data, processing similar to the above is performed by using the 90° differentiation mask. In the case of obtaining derivative value data with respect to directions of 22.5°, 30°, 45° and the like, differentiation masks corresponding to those angles may be prepared and used similarly. Otherwise, the two-dimensional distribution data may be rotated by 22.5°, 30°, 45° and the like, and then the 0° differentiation mask and the 90° differentiation mask may be used to perform processing similar to the above.

The differentiation masks shown in the figure are examples. It is, however, not necessary to stick to these examples, and other masks may be used if they satisfy requirement for a mask used for directional differentiation (i.e., values in the symmetrical positions with respect to some axis have reversed signs and approximately same values). Further, various variations of differentiation masks can be considered in order to suppress noises and to improve selectivity of differential directions. Further, before calculation of differentiation of frame data, a filtering method and a method of contracting the frame data should be selected appropriately for the frame data. As filtering methods, there are ones that perform smoothing for the purpose of noise suppression and ones that weight the center of frame data in order to avoid effect of drift such as change of frame data boundary.

Next, the aberration parameter calculation part 54 obtains various parameters by using directional derivative value data in a plurality of directions with respect to each item of two-dimensional distribution data obtained in step 30 (S40). As processing for obtaining the aberration parameters, there are processing for obtaining parameters of star aberration and spherical aberration (S40a), processing for obtaining parameters of astigmatism, 4-fold astigmatism and focus offset (S40b), and processing for obtaining parameters of 3-fold astigmatism and coma aberration (S40c). Details of these will be described later. Calculated aberration parameters are stored in the storage part 51.

When the parameters are obtained, the control part 56 of the aberration correction value calculation unit 50 judges whether each aberration parameter is less than or equal to a threshold determined previously for that aberration parameter (S50). In the case where all the aberration parameters are less than or equal to the corresponding thresholds, then aberration correction is not performed and the processing is ended. If any aberration parameter is more than its threshold, then the aberration correction value calculation part 55 obtains a correction value for correcting the aberration (S60). The aberration correction value calculation part 55 uses a previously-stored relation between an aberration parameter and a correction value in order to obtain a correction value for the obtained aberration parameter. Then, the control part 56 gives respective correction values for aberrations to the integration control unit 69 to make the aberration corrector 16 perform correction of the aberrations (S70), and the processing returns to step 10 again. Then, the processing of steps 10-70 is repeated until it is judged in step 50 that all the aberration parameters are less than or equal to their thresholds.

Here, when it is judged in step 50 that a plurality of aberration parameters are more than their thresholds, it is possible that correction values for all the aberrations concerned are obtained in step 60 and all the correction values are given to the integration control unit 60 in step 70 to correct these aberrations all at once. Or, it is possible that only a correction value for the aberration of the lowest order among aberrations whose aberration parameters are judged to be more than their thresholds is obtained in step 60 and only this correction value is given to the integration control unit 60 in step 70. In other words, it is possible that lower-order aberration is corrected preferentially. Among aberrations, the aberration of the lowest order is focus offset, followed by astigmatism, coma aberration, 3-fold astigmatism, spherical aberration, 4-fold astigmatism and star aberration. Further, in step 50, the control part 56 of the aberration correction value calculation unit 50 judges whether each aberration parameter is less than or equal to its threshold. In parallel with this, two-dimensional distribution data may be sent to the input-output unit 65 through the integration control unit 60 in order to make the input-output unit 65 display the two-dimensional distribution data, so that two-dimensional frame data are shown to the operator of this scanning electron microscope.

Figure 3:
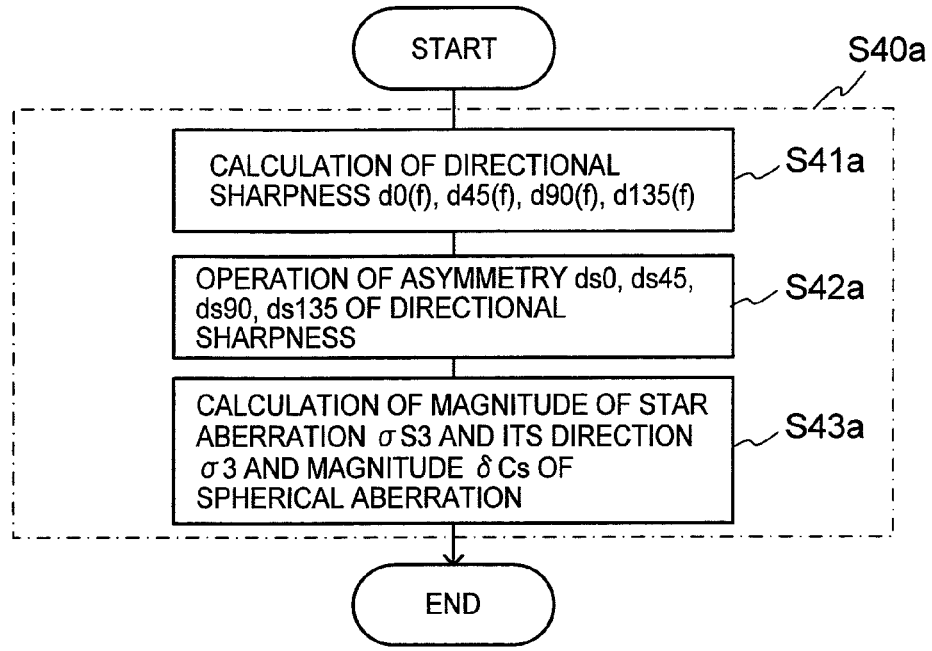
FIG. 3 is a flowchart showing a detailed flow of step 40a in the flowchart of FIG. 2.

Next, among the processes in the aberration parameter calculation processing (S40), details of the processing (S40a) for obtaining the parameters of star aberration and spherical aberration will be described referring to the flowchart shown in FIG. 3.

First, the directional sharpness operation part 54a of the aberration parameter calculation part 54 obtains a directional sharpness dθ(f): {θ: 0°, 45°, 90°, 135°} for each direction by using derivative value data for 0°, 45°, 90° and 135° with respect to each item of two-dimensional distribution data (S41a). In detail, when a directional sharpness d0(f) is to be obtained, then, at the beginning, with respect to two-dimensional distribution data at some focal position f, the sum of absolute values of 0° derivative value data of pixel intensities (gray values) at the points of the two-dimensional distribution data or the sum of square values of the values at those points is obtained. Similarly, by obtaining such sum for each of other focal positions f, f-dependent data on the sum of the absolute values or square values of 0° derivative value data are obtained. The above-mentioned d0(f) is the thus-obtained f-dependent data on the sum of directional derivative values (gradients at points).

Figure 7:
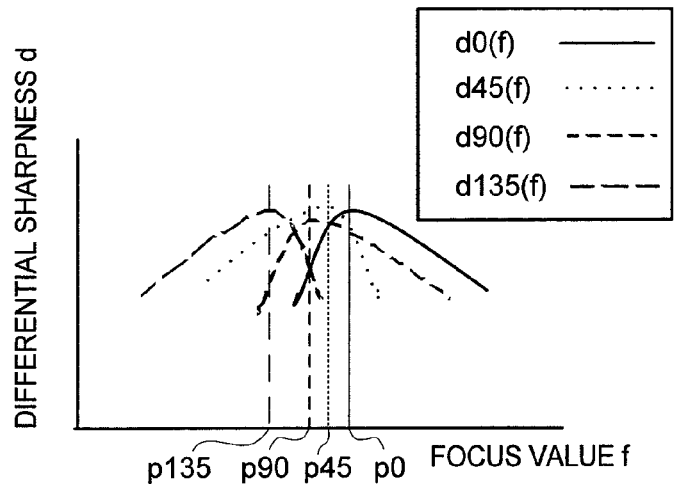
FIG. 7 is a graph showing a relation between directional sharpness and focal position (focus value) for each direction.

FIG. 7 shows the focus value f dependency of the thus-obtained directional sharpness d0(f), d45(f), d90(f), d135(f) for each direction. As shown in the figure, a curve (illustrated as a solid line or a broken line) showing directional sharpness d0(f), d45(f), d90(f), d135(f) for each direction is asymmetric with respect to a specific f at which d takes a local maximum value. In the present embodiment, this position where a directional sharpness d takes the local maximum value is called a center focal position p. In step S42a, the directional sharpness operation part 54a shown in FIG. 1 obtains an asymmetry ds0, ds45, ds90, ds135 of directional sharpness d0(f), d45(f), d90 (f), d135(f) for each direction 0°, 45°, 90°, 135°.

A center focal position p can be obtained by approximating a directional sharpness dθ(f) by a polynomial (for example, a quadratic function) and by taking a local maximum value of this function as a center position pθ. At that time, a function by which the directional sharpness is approximated may be a Gaussian function, and in effect any function can be used as far as it can be used for fitting. Alternatively, with respect to a directional sharpness dθ(f), the center of gravity of a set of points larger than or equal to a threshold may be obtained, to define the center of gravity as a center position pθ.

Several methods of obtaining a center focal position p are described.

Figure 8A:
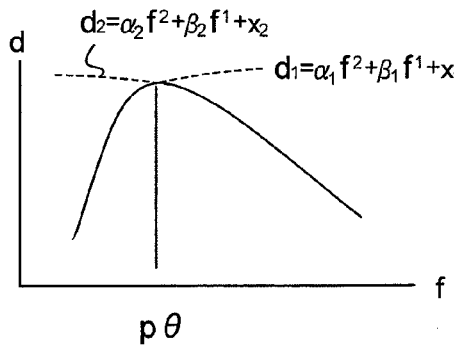
FIG. 8A is a schematic diagram showing a first method of calculating asymmetry.
Figure 8B:
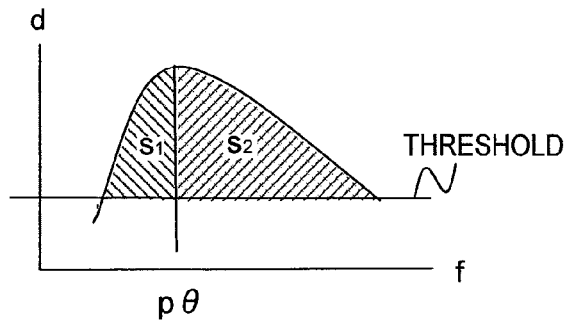
FIG. 8B is a schematic diagram showing a second method of calculating asymmetry.

Next, an asymmetry dsθ is obtained by using directional sharpness dθ(f). FIGS. 8A and 8B show several methods of obtaining an asymmetry dsθ. FIG. 8A shows an example where a curve of directional sharpness dθ(f) is divided into an area of "f>pθ" and an area of "f<pθ" with respect to the center position pθ as a boundary, fitting by a quadratic function is performed for each area independently, and an asymmetry dsθ is determined as a ratio $\alpha_1/\alpha_2$ of coefficients $\alpha_1, \alpha_2$ of the respective highest-order terms of both quadratic functions or a difference $\alpha_1-\alpha_2$ between those coefficients. In this case also, any function (for example, a Gaussian function) that can be used for fitting may be used. FIG. 8B shows a method in which integral values $S_1, S_2$ are obtained for an area of "f<pθ" and an area of "pθ<f" of a set of points larger than or equal to a threshold, and an asymmetry dsθ is determined as a ratio $S_1/S_2$ of the integral values $S_1$ and $S_2$ or a difference $S_1-S_2$ between those integral values. The method shown in FIG. 8A uses the simple calculation formulas requiring shorter calculation times, and thus the load on the operation unit becomes lower. Further, the method shown in FIG. 8B has the advantage that an aberration parameter is obtained very accurately because the whole information included in dθ(f) is used. Here, there is also a method in which the value of center of gravity of a set of points larger than or equal to some threshold is obtained with respect to a directional sharpness dθ(f), a local maximum value of the directional sharpness dθ(f) is obtained, and difference between the center-of-gravity value and the local maximum value is determined as an asymmetry dsθ. The calculation time and obtained effects of this method are almost similar to those of FIG. 8B. However, their characteristics are different with respect to the problem described in the following. In the method of FIG. 8B, it is possible from the viewpoint of calculation that $S_1$ equals $S_2$ ($S_1=S_2$) although the waveform is different between the area of "f<pθ" and the area of "pθ<f". On the other hand, also in the method of obtaining a difference between the center-of-gravity value and the local maximum value, it is possible that there is no difference between the center-of-gravity value and the local maximum value although aberration remains. Although the characteristics of these methods do not denote any relative merits on these problems, it is less likely that both problems occur at the same time. Thus, it is possible to select one method, or partially both, depending on the conditions.

Figure 9:
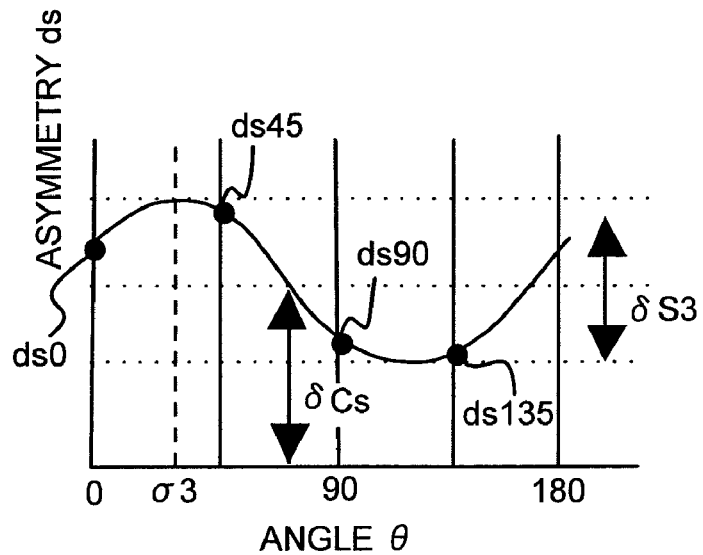
FIG. 9 is a graph showing a relation between asymmetry of directional sharpness and direction (angular)

As shown in FIG. 9, an asymmetry dsθ for a direction is periodic with respect to angle, and thus a periodic function such as a sine wave can be fitted. The aberration parameter operation part 54c performs fitting of the θ-dependent data of asymmetry dsθ by using a sine wave function as mentioned above; obtains a magnitude δS3 proportional to the magnitude of a star aberration, a direction δ3 of the star aberration, and a magnitude δCs proportional to the magnitude of spherical aberration by using the following equations Eq. 1, Eq. 2 and Eq. 3 (S43a); and stores these values in the storage part 51.

$$\delta S3^2 = (ds0 - ds90)^2 + (ds45 - ds135)^2 \qquad \text{Eq. 1}$$

$$\sigma 3 = \frac{1}{2}\text{Arctan}\left(\frac{ds45 - ds135}{ds0 - ds90}\right) \qquad \text{Eq. 2}$$

$$\delta Cs = (ds0 + ds45 + ds90 + ds135)/4 \qquad \text{Eq. 3}$$

Figure 4:
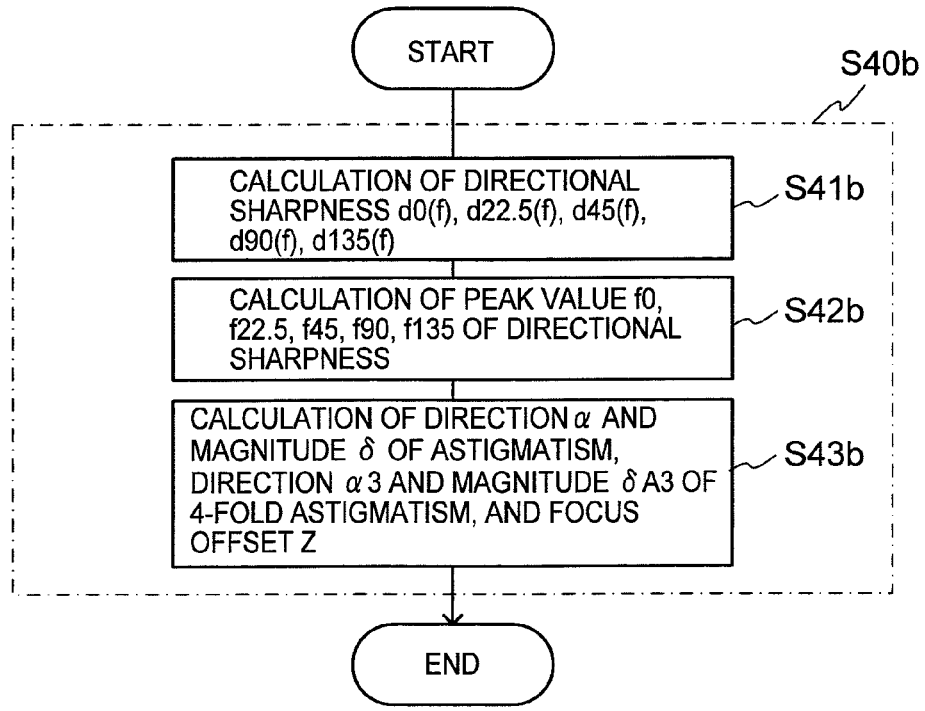
FIG. 4 is a flowchart showing a detailed flow of step 40b in the flowchart of FIG. 2.

Next, among the processes in the aberration parameter calculation processing (S40), details of the processing (S40b) for obtaining the parameters of astigmatism, 4-fold astigmatism and focus offset will be described referring to the flowchart shown in FIG. 4.

First, the directional sharpness operation part 54a of the aberration parameter calculation part 54 obtains a directional sharpness dθ(f) (d0(f), d22.5(f), d45(f), d90(f), d135(f)) for each direction by using derivative value data for 0°, 22.5°, 45°, 90° and 135° with respect to each item of two-dimensional distribution data (S41b). The method of obtaining each directional sharpness dθ(f) is the same as that of obtaining directional sharpness dθ(f) in the above-described step 41a.

Next, the directional sharpness operation part 54a obtains a center focal position p0, p22.5, p45, p90, p135 indicating the peak value with respect to directional sharpness d0(f), d22.5(f), d45(f), d90(f), d135(f) for each direction (S42b). Here, the processing up to obtainment of focus-value-f-dependent data of dθ(f) by using derivative value data for each direction is similar to the processing (S40a) of obtaining parameters of star aberration and spherical aberration. Thus, processing up to the middle of step 40a and the processing in step 42a may be performed in an integrated manner.

Figure 10:
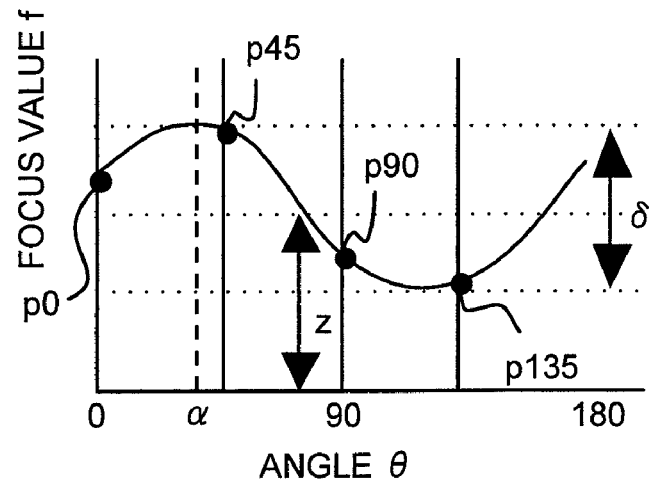
FIG. 10 is a graph showing a relation between focal position (focus value) at which each focal center position is obtained, and direction (angler), this graph being used for explaining periodicity of astigmatism and a method of extracting parameters of the astigmatism.

The above-described calculation processing obtains angular dependent data of a center focal position p$\theta$, i.e., f at which directional sharpness d$\theta$(f) shows a peak value. By performing fitting of the angular dependent data by using the aberration parameters of astigmatism and the aberration parameters of 4-fold astigmatism as fitting parameters, the above-mentioned aberration parameters can be obtained. For the sake of understandability, a sine wave component for obtaining the aberration parameters of astigmatism and a sine wave component for obtaining the aberration parameters of 4-fold astigmatism are shown schematically in FIGS. 10 and 11 respectively. As shown in FIG. 10, in the case of the sine wave of astigmatism, the magnitude $\delta$ of focus displacement (astigmatic difference) owing to the astigmatism appears as the amplitude of this sine wave, and the direction $\alpha$ of focus displacement owing to the astigmatism appears as the angle indicating the peak of this sine wave. Further, the focus offset value z appears as an offset of an inflection point of this sine wave.

Thus, the parameter operation part 54c obtains the magnitude $\delta$ of defocus owing to astigmatism, its direction $\alpha$ and the focus offset value z by using the following Eq. 4, Eq. 5 and Eq. 6 (S43b), and stores the obtained values in the storage part 51.

$$\delta^2 = (p0 - p90)^2 + (p45 - p135)^2 \quad \text{Eq. 4}$$

$$\alpha = \frac{1}{2}\text{Arctan}\left(\frac{p45 - p135}{p0 - p90}\right) \quad \text{Eq. 5}$$

$$z = (p0 + p45 + p90 + p135)/4 \quad \text{Eq. 6}$$

Figure 11:
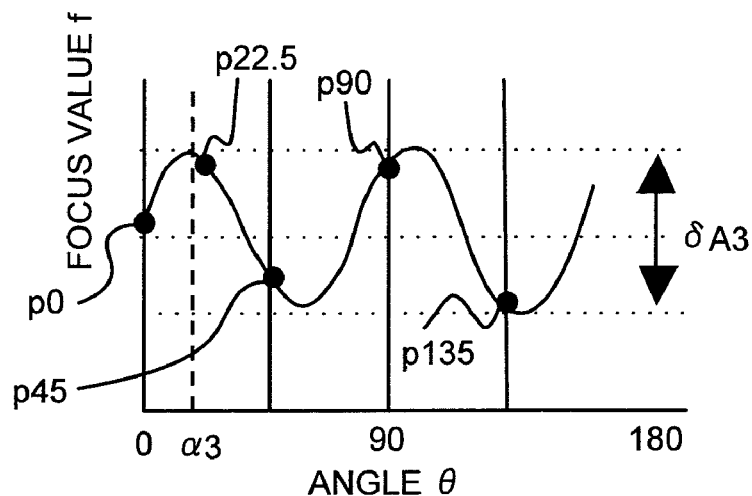
FIG. 11 is a graph showing a relation between focal position (focus value) at which each focal center is obtained, and direction (angle), this graph being used for explaining periodicity of 4-fold astigmatism and a method of extracting parameters of the 4-fold astigmatism.

Further, as shown in FIG. 11, in the case of the sine wave of the 4-fold astigmatism, the magnitude $\delta A3$ of 4-fold astigmatism appears as the amplitude of this sine wave, and its direction $\alpha 3$ as an angle indicating a peak of this sine wave. Thus, the parameter operation part 54c obtains the magnitude $\delta A3$ of 4-fold astigmatism and its direction $\alpha 3$ by using the following Eq. 7 and Eq. 8 (S43b), and stores the obtained values in the storage part 51.

$$\delta A3^2 = \left(\frac{2 \cdot p0 - \delta \cdot}{c\cos(-2\alpha) - 2z}\right)^2 + \left(\frac{2 \cdot p22.5 - \delta \cdot}{\cos(-2\alpha + \pi/4) - 2z}\right)^2 \quad \text{Eq. 7}$$

$$\alpha 3 = \frac{1}{4}\text{Arctan}\left(\frac{p22.5 - \delta \cdot \cos(-2\alpha + \pi/4) - z}{p0 - \delta \cdot \cos(-2\alpha) - z}\right) \quad \text{Eq. 8}$$

In the case of frame data including spherical aberration, as the focus is changed from the just-focused state, the amount of blurring becomes different depending on whether the change is positive or negative while the style of blurring is same. In the case of frame data including star aberration, as the focus is changed from the just-focused state, the style of blurring changes by 90° depending on whether the change is positive or negative while the amount of change of defocus is same. Further, in the case of frame data including 4-fold astigmatism, as the focus is changed from the just-focused state, 4-fold blurring changes its direction by 45° depending on whether the change is positive or negative while the amount of change of defocus is same. As described above, in order to measure these on the basis of frame data in the present embodiment, sharpness at positive or negative change of the focus is analyzed by changing the focal position, to obtain the magnitude of spherical aberration, the magnitude and direction of star aberration, and the magnitude and direction of 4-fold astigmatism. Further, as described above, this method can additionally obtain focus displacement owing to astigmatism and its direction and the focus offset.

Figure 5:
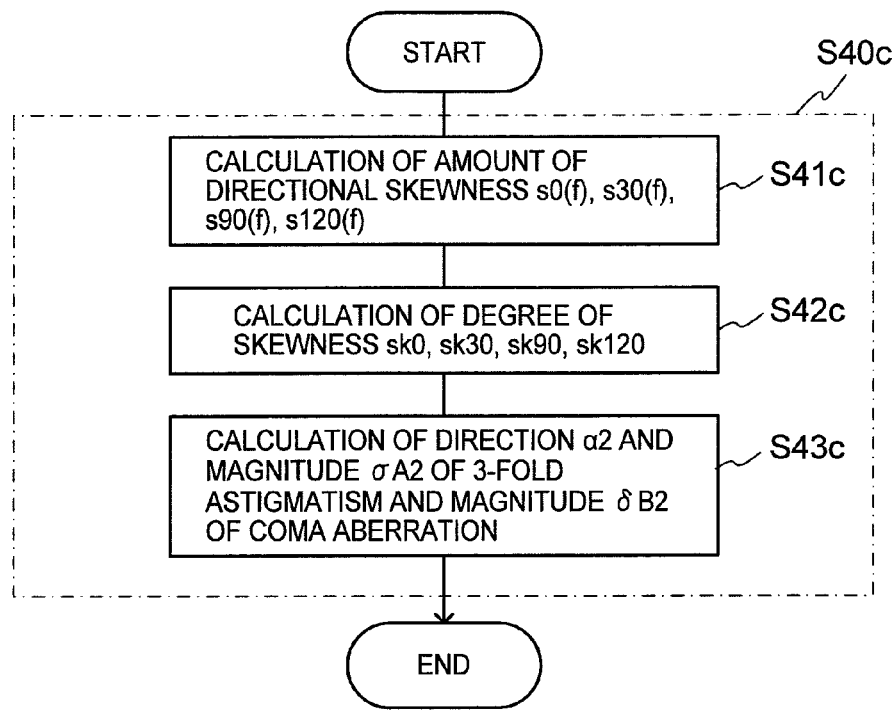
FIG. 5 is a flowchart showing a detailed flow of step 40c in the flowchart of FIG. 2.

Next, among the processes in the aberration parameter calculation processing (S40), details of the processing (S40c) for obtaining the parameters of 3-fold astigmatism and coma aberration will be described referring to the flowchart shown in FIG. 5.

Figure 12:
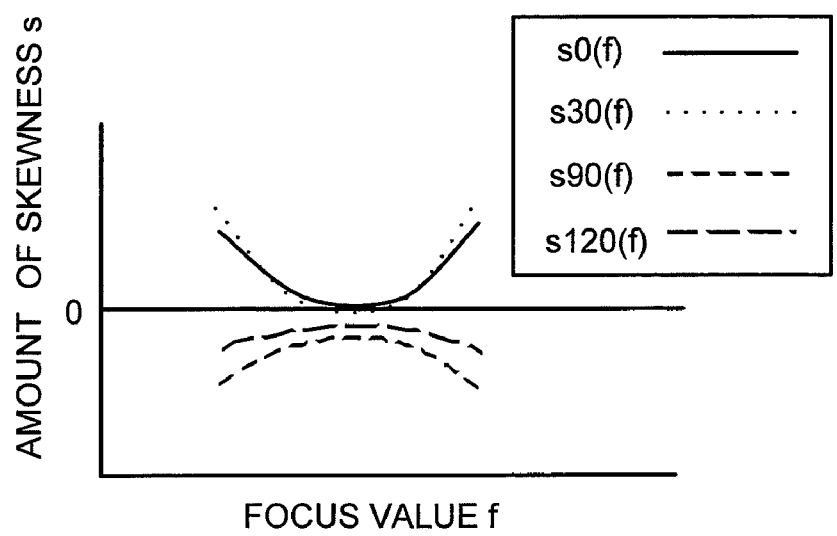
FIG. 12 is a graph showing a relation between amount of directional skewness and focal position (focus value) for each direction.

First, the degree-of-directional-skewness operation part 54b of the aberration parameter calculation part 54 obtains an amount of directional skewness s$\theta$(f) (s0(f), s30(f), s90(f), s120(f)) for each direction by using the derivative value data for 0°, 30°, 90° and 120° with respect to each item of two-dimensional distribution data (S41c). In detail, when the amount of directional skewness s0(f) is to be obtained, then, at the beginning, with respect to two-dimensional distribution data at some focal position f, the sum of values (gray values) of 0° derivative value data at the points of the two-dimensional distribution data is obtained. Similarly, the sum for each of other focal positions f is obtained. Then, a relation of the sum to the focal position f as a variable is determined as the amount of directional skewness s0(f). Thus, in the case where the sum with respect to the points is determined as an amount of directional skewness, the sum of derivative values become zero if a beam bias (anisotropy of brightness) does not exist while the specimen is a uniform one. However, the sum does not become zero if the bias exists, and the direction of bias appears as a sign, and the magnitude of the bias as the magnitude of a numerical value. As shown in FIG. 12, the thus-obtained amount of directional skewness s$\theta$(f) for each direction becomes a quadratic-curve-like function having the base at about the just focus position.

Further, as another example of a method of obtaining an amount of directional skewness, there is a method in which a histogram showing derivative value in the horizontal axis and frequency in the vertical axis is obtained with respect to frame data as a result of differentiation, and an amount of skewness is obtained on the basis of the bias of distribution of this histogram. When an amount of directional skewness is obtained from the bias of a histogram, the following Eq. 9 is used.

$$s\theta = \sum_i^N u_i(\theta)(t_i(\theta) - \mu(\theta))^3 / (U\sigma^3) \quad \text{Eq. 9}$$

In any method of obtaining an amount of skewness such as the method of obtaining it from the sum for the points or the method of obtaining it from a histogram, an obtained amount of skewness is affected by an inclination, shading or particle forms of a specimen. Thus, it is favorable to correct the obtained amount on the basis of the value at the just focus. In that case, as shown in the following (Eq. 10) where s$\theta$(f) is expressed as s$\theta$(f)$_{tilt}$ when there is an inclination or pattern anisotropy of a specimen, effects of the specimen can be cancelled by subtracting the product of an amount of skewness s$\theta$(p) obtained at just focus and a defocus function def(f).

$$\sigma^2 = \frac{1}{U}\sum_i^N u_i(t_i(\theta) - \mu(\theta))^2, \quad \text{Eq. 10}$$

$$\mu(\theta) = \frac{1}{U}\sum_i^N u_i(\theta)t_i(\theta),$$

-continued $$U = \sum_{i}^{N} u_i(\theta)$$

$$s\theta(f) = s\theta(f)_{tilt} - s\theta(p) \cdot def\theta(f)$$

where $u_i(\theta)$ is frequency, $t_i(\theta)$ is a derivative value for the direction $\theta$, and N is the total number of $t_i(\theta)$.

In the case where the directional sharpness $d\theta(f)$ is calculated by using the sum of absolute values, the defocus function $def\theta(f)$ normalized with respect to f=p is used. On the other hand, in the case where the directional sharpness $d\theta(f)$ is calculated by using the sum of the square values, the square root of an amount of skewness is obtained and the defocus function normalized with respect to f=p is used.

Figure 13:
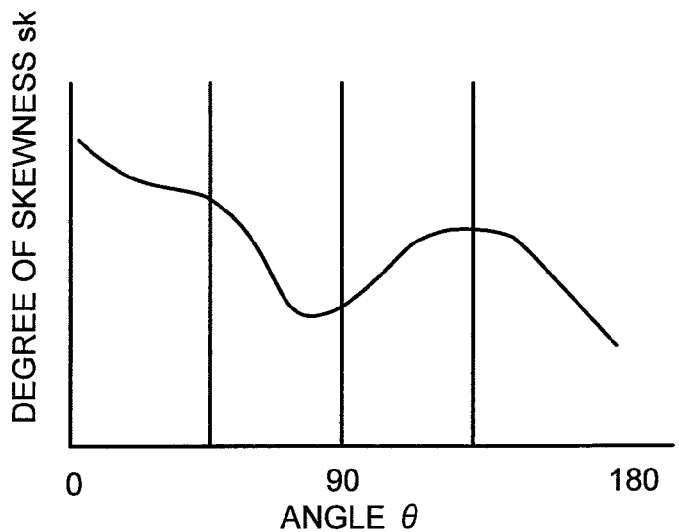
FIG. 13 is a graph showing a relation between degree of directional skewness and direction (angle)

Next, the degree-of-directional-skewness operation part 54b obtains a degree of skewness $sk\theta$ that indicates a tendency of a change of an amount of skewness as the direction (angle) changes, by using an amount of directional skewness $s\theta(f)$ (s0(f), s30(f), s90(f), s120(f) for each direction (S42c). In detail, for example, fitting of an amount of directional skewness $s\theta(f)$ by quadratic functions is performed, and a ratio of quadratic coefficients is expressed as a function of $\theta$ to determine the function as a degree of skewness $sk\theta$. The function used for the fitting may be not a quadratic function but a Gaussian function or the like, and in effect any function can be used as far as it can be used for fitting. Further, although here a ratio of coefficients is defined as a degree of skewness, a difference between coefficients may be defined as a degree of skewness. For example, a degree of skewness $sk\theta$ becomes a function as shown in FIG. 13.

Figure 14:
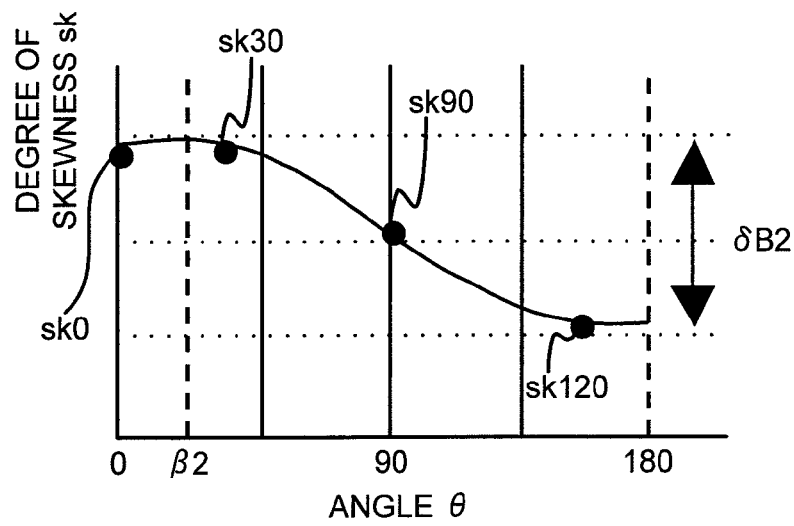
FIG. 14 is a graph showing a relation between degree of directional skewness and direction (angle), this graph being used for explaining periodicity of coma aberration and a method of extracting parameters of the coma aberration.
Figure 15:
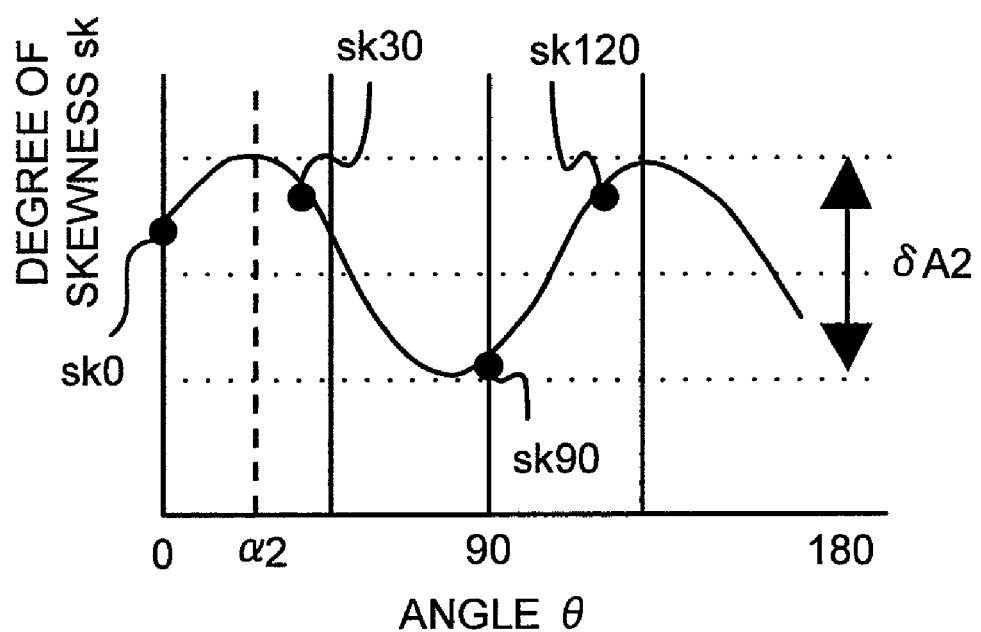
FIG. 15 is a graph showing a relation between degree of directional skewness and direction (angle), this graph being used for explaining periodicity of 3-fold astigmatism and a method of extracting parameters of the 3-fold astigmatism.

Degree of skewness $sk\theta$ can be divided into a sine wave for coma aberration as shown in FIG. 14 and a sine wave for 3-fold astigmatism as shown in FIG. 15. As shown in FIG. 14, in a sine wave for coma aberration, the magnitude $\delta B2$ of coma aberration appears as the amplitude of the sine wave, and its direction $\beta 2$ as the angle showing the peak of the sine wave. Further, as shown in FIG. 15, in a sine wave for 3-fold astigmatism, its magnitude $\beta A2$ appears as the amplitude of the sine wave, and its direction $\alpha 2$ as the angle showing the peak of the sine wave. Thus, the parameter operation part 54c obtains the magnitude $\delta B2$ and direction $\beta 2$ of coma aberration by using the following Eq. 11 and Eq. 12, and obtains the magnitude $\delta A2$ and direction $\alpha 2$ of 3-fold astigmatism by using the following Eq. 13 and Eq. 14, and stores the obtained values in the storage part 51 (S43c).

$$\delta B2^2 = 4/3(sk0 - sk120)^2 + 4/3(sk90 + sk30)^2 \qquad \text{Eq. 11}$$

$$\beta 2 = \text{Arctan}\left(\frac{\sqrt{3} - K}{1 - K\sqrt{3}}\right), K = \frac{sk0 - sk120}{sk90 + sk30} \qquad \text{Eq. 12}$$

$$\delta A2^2 = \left(\frac{2 \cdot sk0 -}{\delta B2\cos(-\beta 2)}\right)^2 + \left(\frac{2 \cdot sk30 -}{\delta B2\cos(-\beta 2 + \pi/6)}\right)^2 \qquad \text{Eq. 13}$$

$$\alpha 2 = \frac{1}{3}\text{Arctan}\left(\frac{2 \cdot sk30 - \delta B2\cos(-\beta 2 + \pi/6)}{2 \cdot sk0 - \delta B2\cos(-\beta 2)}\right) \qquad \text{Eq. 14}$$

In the case of frame data including 3-fold astigmatism, as the focus is changed from the just-focused state, the frame data do not blur uniformly but blurs in a triangular shape in the same direction without depending on whether the focus change is positive or negative. In the case of frame data including coma aberration, as the focus is changed from the just-focused state, the frame data do not blur uniformly but blurs in one direction without depending on whether the focus change is positive or negative. In order to measure such phenomena on the basis of frame data, the present embodiment defines the degree of directional skewness, obtains the amount of directional skewness by changing the focal position, further obtains the degree of skewness showing a tendency of change in the amount of directional skewness that accompanies a directional change, and obtains the magnitudes and directions of 3-fold astigmatism and coma aberration by using those values.

As described above, when the aberration parameters are obtained (S40), it is judged that each of the aberration parameter is less than or equal to its previously-determined threshold (S50). When some aberration parameter is larger than its threshold, a correction value for correcting the aberration is obtained (S60). Then, correction values of aberrations are given to the integration control unit 60, and the aberration corrector 16 corrects the aberrations (S70). The correction values of aberrations are set in the aberration corrector power supply circuit 36, and as a result the aberration corrector 16 operates toward the direction of canceling the aberrations. Thus, the aberrations are corrected. Here, it is also possible to correct the focus offset by operating the objective lens 15. Accordingly, the correction value may be set in the objective lens power supply circuit 38.

As described above, according to the present embodiment, directional derivative value data concerning a plurality of directions are obtained with respect to each item of two-dimensional distribution data of different focal positions, and various aberration parameters are obtained from these items of directional derivative data. Since random noise is removed in the course of differentiating two-dimensional distribution data in obtainment of aberration parameters from directional derivative value data, it is possible to obtain aberration parameter accurately even if two-dimensional distribution data are relatively coarse. This means that aberration parameters can be obtained accurately even if the so-called frame data that have not subjected to image integration or image processing for improving an S/N ratio. Further, aberration parameters can be obtained accurately even when the scanning speed of electron beam is increased (i.e. even when two-dimensional distribution data has a lower S/N ratio). As a result, even when the required number of frames of frame data becomes larger, the acquisition time of one frame of frame data can be reduced, and consequently the time required for adjusting the aberration corrector can be shortened. Further, the scanning speed of an electron beam can be raised, and accordingly damage to a specimen M can be reduced.

Further, according to the present embodiment, directional sharpness and degree of directional skewness of frame data of the same specimen M are obtained by changing the focal length, and aberration parameters can be obtained from those values. Thus, the aberration parameters can be obtained without depending on a pattern of the specimen M. As a result, high-precision aberration correction can be performed in parallel with conventional automatic focus operation or automatic stigmatism operation. The calculations of aberration parameters by the methods of the present embodiment are simple processing for a computer used for SEM and the calculations themselves can be performed at high speed. A part of calculations in automatic focusing or automatic stigmatism operation can be shared, and accordingly the aberration parameter calculation part does not need addition of special hardware or conversion of hardware.

Further, the present embodiment is provided with a height sensor 39. As a result, by obtaining previously a relation between change in the height of a specimen M and change in an aberration correction value, it is possible to correct the aberration according to the height of the specimen M, reducing the number of times of repeating aberration correction.

In the above embodiment, angles such as 0°, 45°, 90°, 135° are employed as directions for obtaining directional derivative value data. However, it is not necessary to employ these specific angles. Further, the number of angles for obtaining derivative value data is sufficient if the parameters can be obtained. In detail, as for directional sharpness, it is sufficient that sharpness can be obtained for at least five angles. As for degree of directional skewness, it is sufficient that at least four values of skewness can be obtained, and the number of angles may be larger than this. Further, as the number of frames (or items) of frame data having different focal positions, the present embodiment assumes ten or more as described above. However, at least three frames are sufficient. Further, it is not necessary that items of frame data do not include a just-focused item of frame data, and it is sufficient that there is an item of frame data at a focal position near to the just focus.

Further, according to the above embodiment, aberration correction values obtained by the aberration correction value calculation unit 50 are set in the aberration corrector power supply circuit 36 through the integration control unit 60. However, the aberration correction value calculation unit 50 may directly set aberration correction values in the aberration corrector power supply circuit 36. Further, according to the above embodiment, a computer having a frame data processing function implements the image processing unit 40; a computer having an aberration correction value calculation function implements the aberration correction value calculation unit 50; and a computer having an integration control function implements the integration control unit 60. However, a computer having a frame data processing function and an aberration correction value calculation function may implement a frame data processing/aberration correction value calculation unit. A computer having an aberration correction value calculation function and an integration control function may implement an aberration correction value calculation/integration control unit.

Further, the above-described embodiment is a case where the present invention is applied to an ordinary scanning electron microscope. The present invention is not limited to this. For example, the present invention can be applied to a critical dimension scanning electron microscope (CD-SEM) or a defect review scanning electron microscope (DR-SEM), of course.

The invention claimed is:

1. A charged particle beam apparatus comprising:
   an electron optical system, which detects secondary particles generated by irradiation of a specimen with a primary charged particle beam and obtains secondary particle distribution data for an irradiation area of the charged particle beam in any focus state; and
   a processing unit which processes the secondary particle distribution data obtained by the electron optical system; wherein:
   the electron optical system comprises an aberration corrector which removes aberration of the primary charged particle beam on the specimen by giving reverse aberration to aberration generated by the electron optical system; and
   the processing unit:
   obtains derivative values in a plurality of directions for each item of secondary particle distribution data of the specimen, obtained in different focus states;
   obtains aberration parameters of the aberration based on asymmetry of distribution of the directional derivative values in the focus states; and
   determines operation conditions of the aberration corrector based on the obtained aberration parameters.

2. A charged particle beam apparatus of claim 1, wherein: the electron optical system can correct at least one aberration among coma aberration, spherical aberration, star aberration, 3-fold astigmatism, and 4-fold astigmatism.

3. A charged particle beam apparatus of claim 1, further comprising an aberration corrector control unit, which makes the aberration corrector operate under the operation conditions.

4. A charged particle beam apparatus of claim 1, further comprising:
   an electron optical system control unit, which controls the electron optical system; and
   a correction image acquisition instruction unit, which instructs the electron optical system control unit to acquire the items of secondary particle distribution data in different focus states.

5. A charged particle beam apparatus comprising:
   an electron optical system, which detects secondary particles generated by irradiation of a specimen with a primary charged particle beam and obtains secondary particle distribution data for an irradiation area of the charged particle beam in any focus state;
   an aberration corrector provided for the electron optical system;
   a directional differentiation operation unit, which obtains derivative values in a plurality of directions for each item of secondary particle distribution data of the specimen, obtained in different focus states;
   an aberration parameter calculation unit, which obtains aberration parameters of aberration to be corrected by the aberration corrector, by using asymmetry of distribution of the directional derivative values in the plurality of directions in the focus states; and
   an aberration correction value calculation unit, which calculates operation conditions of the aberration corrector for correcting the aberration, by using the aberration parameters.

6. A charged particle beam apparatus of claim 5, wherein: the electron optical system can correct at least one aberration among coma aberration, spherical aberration, star aberration, 3-fold astigmatism, and 4-fold astigmatism.

7. A charged particle beam apparatus of claim 6, wherein the aberration parameter calculation unit comprises:
   a directional sharpness operation unit, which obtains directional sharpness for each differential direction by using the directional derivative values for each of the items of secondary particle distribution data; and
   an aberration parameter operation unit, which obtains the aberration parameters by using the directional sharpness.

8. A charged particle beam apparatus of claim 5, wherein: the aberration corrector can further correct astigmatism and focus offset; and
   the aberration parameter operation unit obtains parameters of the astigmatism and parameters of the focus offset by substituting the directional sharpness for each differential direction into a prescribed astigmatism calculation formula and a prescribed focus offset calculation formula.

9. A charged particle beam apparatus of claim 5, wherein:
the aberration corrector can correct at least one aberration among coma aberration and 3-fold astigmatism; and
the aberration parameter calculation unit comprises:
- a degree-of-directional-skewness operation unit, which obtains an amount of directional skewness for each differential direction by using the directional derivative values with respect to each of the items of secondary particle distribution data, and obtains a degree of directional skewness showing tendency of change of the amount of directional skewness with respect to the differential direction by using the amount of directional skewness for each differential direction; and
- an aberration parameter operation unit, which obtains the at least one aberration parameter by substituting the degree of directional skewness for each differential direction into a prescribed calculation formula.

10. A charged particle beam apparatus of claim 5, further comprising a judgment unit, which judges whether an aberration parameter obtained by the aberration correction value calculation unit is less than or equal to a prescribed threshold; wherein
the aberration correction value calculation unit obtains a correction value of the aberration when the aberration parameter is judged to be larger than the prescribed threshold.

11. A charged particle beam apparatus of claim 5, further comprising an aberration corrector control unit, which makes the aberration corrector operate under the operation conditions.

12. A charged particle beam apparatus of claim 5, wherein:
the charged particle beam apparatus further comprises:
an electron optical system control unit, which controls the electron optical system; and
a correction image acquisition instruction unit, which instructs the electron optical system control unit to acquire the items of secondary particle distribution data in different focus states.

13. An aberration correction program for a charged particle beam apparatus comprising an irradiation optical system for scanning a specimen by irradiating a charged particle beam on the specimen, an optical system control unit that controls the irradiation optical system, a detection optical system for acquiring secondary particles from the specimen irradiated by the charged particle beam, and an image acquisition unit that obtains a two-dimensional particle image from the secondary particles acquired by the detection optical system; the irradiation optical system comprising an aberration corrector that can correct at least one aberration among coma aberration, spherical aberration, star aberration, 3-fold astigmatism, and 4-fold astigmatism; the optical system control unit comprising a focus control unit that changes focal position of the charged particle beam and a correction optical system control unit that controls the aberration corrector; wherein the aberration correction program makes a computer execute:
correction image acquisition instruction, in which the focus control unit changes the focal position, and the image acquisition unit acquires items of two-dimensional image data at different focal positions, and a storage area of the computer stores the items of two-dimensional image data;
directional differentiation operation, in which the items of two-dimensional image data at different focal positions are read from the storage area, and directional derivative values in a plurality of directions are obtained for each of the items of two-dimensional image data at different focal positions;
aberration parameter calculation, in which parameters of the at least one aberration are obtained according to a predetermined method by using the directional derivative values in the plurality of directions, which are obtained in the directional differentiation operation for each of the items of two-dimensional image data;
aberration correction value calculation, in which a correction value for the at least one aberration is obtained from the aberration parameters of the at least one aberration; and
correction value setting, in which the correction value of the at least one aberration is set in the correction optical control unit to make the aberration corrector execute aberration correction.

* * * * *